(12) United States Patent
Runze

(10) Patent No.: US 7,535,385 B2
(45) Date of Patent: May 19, 2009

(54) TIME BASE ADJUSTMENT IN A DATA PROCESSING DEVICE

(75) Inventor: Gerhard Runze, Oberasbach (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/575,773

(22) PCT Filed: Oct. 11, 2004

(86) PCT No.: PCT/IB2004/052039

§ 371 (c)(1),
(2), (4) Date: Apr. 12, 2006

(87) PCT Pub. No.: WO2005/039048

PCT Pub. Date: Apr. 28, 2005

(65) Prior Publication Data

US 2007/0030182 A1    Feb. 8, 2007

(30) Foreign Application Priority Data

Oct. 16, 2003 (EP) .................................. 03103840

(51) Int. Cl.
*H03M 7/00* (2006.01)

(52) U.S. Cl. ............................. 341/61; 341/50; 341/51
(58) Field of Classification Search ............. 341/61, 341/50, 51; 708/319
See application file for complete search history.

(56) References Cited

U.S. PATENT DOCUMENTS 5,400,271 A    3/1995    Himeno
5,548,542 A *  8/1996    Rauth et al. .................. 708/319

FOREIGN PATENT DOCUMENTS

EP    0 975 091    1/2000

* cited by examiner

*Primary Examiner*—Jean B Jeanglaude

(57) ABSTRACT

A data processing device and adjusting method for adjusting the timing of a higher-rate stream of second data samples derived from a lower-rate stream of first data samples are described. A predetermined one of the first data samples is stored and first predetermined ones of the second data samples derived from the stored predetermined one of the first data samples are skipped to obtain an acceleration of the time base. Then, second predetermined ones of the second data samples following the skipped first predetermined ones of the second data samples are replaced by new second data samples derived from the stored predetermined one of the first data samples.

8 Claims, 6 Drawing Sheets

TIME BASE ADJUSTMENT IN A DATA PROCESSING DEVICE

This application is a National Stage Entry of PCT/IB04/52039, filed 10/11/2004, the contents of which application are herein incorporated by reference in their entirety The present invention relates to a method and data processing device for adjusting the timing or time base of a higher-rate stream of second data samples derived from a lower-rate stream of first data samples. In particular, the present invention relates to an interpolation filter device and method for time base adjustment, e.g., of an uplink data stream in a Universal Mobile Telecommunications System (UMTS).

The UMTS standard requires time base adjustment of the uplink data stream from a mobile terminal or user equipment to a base station device or Node B device, as defined for example in the 3GPP (3rd Generation Partnership Project) specification TS 25.133, v.3.2.0, chapter 7.

According to the time base adjustment required in the above 3GPP standard, starting from a predetermined point in time, all following "chips", which denote one symbol when referring to spreading code signals, have to be transmitted either earlier or later by a time period corresponding to a quarter of a chip period. The procedure can occur at a maximum of once per 200 ms. Besides the above mentioned 3GPP specification, further details can be gathered from the 3GPP specifications TS 25.214, v3.2.0, chapter 4.3.4, or TS 25.123, v3.2.0, chapter 8, or TS 25.224, v3.3.0, chapter 4.3.

FIG. 1 shows a schematic block diagram of a data processing device for processing an in-phase component $i_1$ and a quadrature component $q_1$ in respective interpolation filters, e.g. Root-Raised-Cosine (RRC) filters 1 followed by respective digital-to-analog (D/A) converters 2. The UMTS standard requires time base adjustment of the uplink data stream in steps of a quarter of a chip, which corresponds to approximately 65.1 Ins. As this adjustment has to be carried out during a transmission, the interpolating or pulse-shaping RRC filters 1 or any other suitable data processing device can be used for efficient implementation.

According to FIG. 1, the signals $i_1$ and $q_1$ are usually supplied to the pulse-shaping filter 1 at a chip rate or first data rate $R_1$, for example $R_1$=3.84 Mcps (Mega chips per second). The chip sequence is indexed by $k_1$. The pulse-shaping filter 1 is used for spectral limitation of the transmitted signals and generates output signals $i_2$ and $q_2$ at a second data rate $R_2$. The second data rate $R_2$ of the signals $i_2$ and $q_2$ is four times as large as the chip rate $R_1$, e.g. $R_2$=15.36 Mcps, and is generated by interpolation of the signal values of $i_1$ and $q_1$ by means of the pulse-shaping filter 1. The higher data rate is indexed by $k_2$. At the output of the D/A converters, analog signals $i_3(t)$ and $q_3(t)$ are generated.

FIG. 2 shows an exemplary functional block diagram of the interpolation filter 1 with a timing adjustment functionality of the in-phase signal path of FIG. 1. A switching arrangement 3 with a switch $S_1$ is provided to successively supply three zero data values between each input data sample of $i_1$ by successively switching the switch $S_1$ by the higher data rate or clock rate $R_2$. This already leads to a fourfold increase in the data rate, i.e. oversampling. Each of the generated higher number of signal values or data samples is multiplied by all N filter coefficients $b_v$, by means of a number N of multipliers 4. The results of multiplication are supplied to a number N−1 of adders 5, except for the result of multiplication by the filter coefficient $b_{N-1}$. Each of the adding results is delayed by one cycle of the data rate $R_2$ in corresponding delay elements 6 and the delayed results are then sequentially accumulated as shown in FIG. 2, so as to generate the output data stream $i_2(k_2)$.

However, the implementation example shown in FIG. 2 requires a lot of multipliers 4 and adders 5. Therefore, a more efficient way of implementing such an interpolation filter has been proposed.

FIG. 3 shows an example of such a modified efficient interpolation filter. Instead of increasing the data rate of the input signal by introducing zero samples and interpolating or smoothing the obtained higher rate signal by a corresponding filter, the fact is utilized that the incorporated zero samples do not contribute after multiplication with the filter coefficients to the chain of delayed adders 5, so as to reduce the number of multipliers 4 and also adders 5. According to FIG. 3, an efficient filter arrangement is shown which requires only a quarter of multipliers 4 and nearly a quarter of adders 5. Instead of using the delay elements with a delay corresponding to a single clock cycle of the second data rate $R_2$, new delay elements 8 having a delay time corresponding to four clock cycles of the second data rate $R_2$, or as an alternative, a chain connection of four delay elements each with a delay time corresponding to a single clock cycle of the second data rate $R_2$ can be used.

As a specific amendment in this efficient filter arrangement, the filter coefficients $b_v$, have to be exchanged after each clock cycle of the second data rate $R_2$, which is achieved in FIG. 3 by adding a switching function 7, according to which a switch $S_1$ successively switches to different switching connections "0" to "3" to successively apply four filter coefficients to a single multiplier 4. This is performed periodically at the second data rate $R_2$. second data rate $R_2$.

TABLE 1

| | | | | | | | | | | | | | | | | | | | | |
|---|---|---|---|---|---|---|---|---|---|---|---|---|---|---|---|---|---|---|---|---|
| | | | | | | | | | | time | | | | | | | | | | |
| Input | | i1(k1) | | | | i1(k1 + 1) | | | | i1(k1 + 2) | | | | i1(k1 + 3) | | | | i1(k1 + 4) | | |
| signal | | | | | | | | | | | | | | | | | | | | |
| S1 | 0 | 1 | 2 | 3 | 0 | 1 | 2 | 3 | 0 | 1 | 2 | 3 | 0 | 1 | 2 | 3 | 0 | 1 | 2 | 3 |
| Multiplier 1 | i1(0) b0 | i1(0) b1 | i1(0) b2 | i1(0) b3 | i1(1) b0 | i1(1) b1 | i1(1) b2 | i1(1) b3 | i1(2) b0 | i1(2) b1 | i1(2) b2 | i1(2) b3 | i1(3) b0 | i1(3) b1 | i1(3) b2 | i1(3) b3 | i1(4) b0 | i1(4) b1 | i1(4) b2 | i1(4) b3 |
| Multiplier 2 | i1(0) b4 | i1(0) b5 | i1(0) b6 | i1(0) b7 | i1(1) b4 | i1(1) b5 | i1(1) b6 | i1(1) b7 | i1(2) b4 | i1(2) b5 | i1(2) b6 | i1(2) b7 | i1(3) b4 | i1(3) b5 | i1(3) b6 | i1(3) b7 | i1(4) b4 | i1(4) b5 | i1(4) b6 | i1(4) b7 |
| Multiplier 3 | i1(0) b8 | i1(0) b9 | i1(0) b10 | i1(0) b11 | i1(1) b8 | i1(1) b9 | i1(1) b10 | i1(1) b11 | i1(2) b8 | i1(2) b9 | i1(2) b10 | i1(2) b11 | i1(3) b8 | i1(3) b9 | i1(3) b10 | i1(3) b11 | i1(4) b8 | i1(4) b9 | i1(4) b10 | i1(4) b11 |
| Multiplier 4 | i1(0) b12 | i1(0) b13 | i1(0) b14 | i1(0) b15 | i1(1) b12 | i1(1) b13 | i1(1) b14 | i1(1) b15 | i1(2) b12 | i1(2) b13 | i1(2) b14 | i1(2) b15 | i1(3) b12 | i1(3) b13 | i1(3) b14 | i1(3) b15 | i1(4) b12 | i1(4) b13 | i1(4) b14 | i1(4) b15 |

The above table 1 shows an example of the efficient interpolation filter shown in FIG. 3 in case a filter with N=16 filter coefficients is used In table 1, each column corresponds to a clock cycle of the second data rate $R_2$, while the values in each column indicate the connection state of the switch $S_1$ of the switching function 7 and the respective sample values received at the multipliers 4 at the four stages of the interpolation filter. As can be gathered from table 1, the data samples $i_1$ remain the same within a period of four clock cycles of the second data rate $R_2$, which period corresponds to the clock cycle of the first data rate $R_1$ at the input of the interpolation filter 1. In the first phase, the switch $S_1$ of the respective switching functions 7 is connected to the switch terminal "0" and thus the input sample or input value $i_1(0)$ is multiplied in parallel with the filter coefficients $b_0$, $b_4$, $b_8$ and $b_{12}$. The multiplication results at the output of the multipliers 4 are then added in the respective adders 5 with the first one of the stored previous values obtained at the output of the respective delay elements 8, and is supplied to the respective other delay elements or, respectively, output as the first output value $i_2(0)$. In the second phase, the same value $i_1(0)$ is multiplied by the filter coefficients $b_1$, $b_5$, $b_9$ and $b_{13}$, when the switch $S_1$ of the switching function 7 is connected to the switching terminal "1". The multiplication results are added with a respective previous result and supplied to the respective delay elements 8 or, respectively, output as a second output value $i_2(1)$. This continues in the third and fourth phase, and then the next input value $i_1(1)$ is again multiplied by the filter coefficients $b_0$, $b_4$, $b_8$ and $b_{12}$.

In case the data stream is to be delayed by a quarter of a chip clock of the first data rate $R_1$, e.g. by a clock cycle of the higher second data rate $R_2$, four instead of three zero samples have to be inserted in the filter arrangement of FIG. 2 or, respectively, the switching mechanism of the switching function 7 in the filter arrangement of FIG. 3 for selecting the filter coefficients has to be freezed or stopped by one clock and instead zero samples have to be supplied to the respective multipliers 4. This freezing must be done after the multiplication by the coefficients $b_3$, $b_7$, $b_{11}$, ..., $b_{N-1}$.

filter coefficients are used as in the above example. As can be gathered from table 2, an additional cycle has been inserted or introduced after the fourth cycle of the second clock rate $R_2$, wherein a zero data sample is supplied as the input signal during this additional single cycle.

FIG. 4 shows a modification of the efficient filter arrangement in which such a delay function is introduced. This is achieved by adding a second switching function 9 comprising a switch $S_2$ which can be switched to a first switching terminal "0" and a second switching terminal "1" to which a zero sample or zero data value is applied. After the phase, in which the input signal $i_1(k_1)$ has been multiplied by the filter coefficients $b_3$, $b_7$, $b_{11}$ and $b_{15}$, the second switching function 9 is switched to the second switching terminal "1", so that for one clock cycle of the higher second data rate $R_2$ the zero value is again multiplied by the present filter coefficients $b_3$, $b_7$, $b_{11}$ and $b_{15}$ due to the fact that the switching operation of the first switching function 7 has been freezed by one cycle. Thereby, zero values are obtained at the output of the respective multipliers 4 and are supplied to the delay elements or delay chains 8. Due to the fact that the switching function 9 switches to terminal "1", such that a "0" sample is applied to the multipliers 4, any coefficient may be applied to these multipliers 4 by the switching function 7. I.e., during the phase when the switching function 9 is switched to terminal "1", the switching function 7 can be connected to any input terminal.

However, if the data stream is to be accelerated by a quarter of the chip clock of the first data rate $R_1$, only two zero values would have to be inserted in the filter arrangement of FIG. 2, while in the filter arrangement of FIG. 3, a multiplication of two successive input values $i_1(k_1)$ and $i_1(k_1+1)$ with respective successive filter coefficients would have to be performed, which is not possible due to the limited number of multipliers 4. If in case of the efficient implementation of FIG. 3 only the

TABLE 2

| | time | | | | | | | | | | |
|---|---|---|---|---|---|---|---|---|---|---|---|
| Input signal | i1(k1) | | | | 0 | i1(k1 + 1) | | | | i1(k1 + 2) | |
| S1 | 0 | 1 | 2 | 3 | 3 | 0 | 1 | 2 | 3 | 0 | 1 |
| S2 | 0 | 0 | 0 | 0 | 1 | 0 | 0 | 0 | 0 | 0 | 0 |
| Multiplier 1 | i1(0) b0 | i1(0) b1 | i1(0) b2 | i1(0) b3 | 0 b3 | i1(1) b0 | i1(1) b1 | i1(1) b2 | i1(1) b3 | i1(2) b0 | i1(2) b1 |
| Multiplier 2 | i1(0) b4 | i1(0) b5 | i1(0) b6 | i1(0) b7 | 0 b7 | i1(1) b4 | i1(1) b5 | i1(1) b6 | i1(1) b7 | i1(2) b4 | i1(2) b5 |
| Multiplier 3 | i1(0) b8 | i1(0) b9 | i1(0) b10 | i1(0) b11 | 0 b11 | i1(1) b8 | i1(1) b9 | i1(1) b10 | i1(1) b11 | i1(2) b8 | i1(2) b9 |
| Multiplier 4 | i1(0) b12 | i1(0) b13 | i1(0) b14 | i1(0) b15 | 0 b16 | i1(1) b12 | i1(1) b13 | i1(1) b14 | i1(1) b15 | i1(2) b12 | i1(2) b13 |

| | time | | | | | | | | | |
|---|---|---|---|---|---|---|---|---|---|---|
| Input signal | i1(k1 + 2) | | i1(k1 + 3) | | | | i1(k1 + 4) | | | |
| S1 | 2 | 3 | 0 | 1 | 2 | 3 | 0 | 1 | 2 | 3 |
| S2 | 0 | 0 | 0 | 0 | 0 | 0 | 0 | 0 | 0 | 0 |
| Multiplier 1 | i1(2) b2 | i1(2) b3 | i1(3) b0 | i1(3) b1 | i1(3) b2 | i1(3) b3 | i1(4) b0 | i1(4) b1 | i1(4) b2 | i1(4) b3 |
| Multiplier 2 | i1(2) b6 | i1(2) b7 | i1(3) b4 | i1(3) b5 | i1(3) b6 | i1(3) b7 | i1(4) b4 | i1(4) b5 | i1(4) b6 | i1(4) b7 |
| Multiplier 3 | i1(2) b10 | i1(2) b11 | i1(3) b8 | i1(3) b9 | i1(3) b10 | i1(3) b11 | i1(4) b8 | i1(4) b9 | i1(4) b10 | i1(4) b11 |
| Multiplier 4 | i1(2) b14 | i1(2) b15 | i1(3) b12 | i1(3) b13 | i1(3) b14 | i1(3) b15 | i1(4) b12 | i1(4) b13 | i1(4) b14 | i1(4) b15 |

Table 2 shows an example of such a delay operation by a quarter of the chip clock of the first data rate $R_1$ in case N=16 multiplication of the first input value $i_1(k_1)$ with the filter coefficients $b_3$, $b_7$, $b_{11}$, $b_{15}$ would be performed but not the multiplication of the second input value $i_1(k_1+1)$ with the filter coefficients $b_0$, $b_4$, $b_8$, $b_{12}$, a substantial interpolation error could be generated.

It is therefore an object of the present invention to provide a data processing device and an adjusting method, by means of which an input data stream can be accelerated by a fraction of the input clock cycle while maintaining an efficient data processing scheme.

This object is achieved by a data processing device as claimed in claim 1 and by an adjusting method as claimed in claim 8.

Accordingly, a predetermined one of the first data samples is stored, so as to be able to partly reintroduce data samples skipped by the acceleration operation at a later stage by replacing later data samples by new data samples obtained from the stored first data sample. Thus, the fact is utilized that typically the coefficients at the beginning and at the end of an impulse response of a data processing device, such as the interpolation filter, are very small in their value. Instead of omitting or skipping all of the second data samples derived from a predetermined first data sample, predetermined following second data samples are replaced by new data samples derived from the stored first data sample. Thereby, the interpolation error can be reduced significantly, while the circuit arrangement does not require any substantial modifications. Consequently, the efficient implementation of the data processing device can be left fairly unchanged. This applies to any data processing device where an input stream of first data samples is used for generating an output stream of second data samples at a higher second rate by inserting additional data samples generated from the first data samples. Examples of such a data processing device are interpolation filters where an adjustment of the time base by a fraction of the input data rate is required In particular, the data processing device may be an interpolation filter in which the second data samples are obtained by a successively multiplying each of the first data samples by a set of filter coefficients, and by adding an obtained result of multiplication at a particular filter stage to a delayed result of the preceding filter stage, wherein the delayed result has been delayed by a delay time corresponding to a time period of the first rate. The skipped first predetermined ones of the second data samples may be skipped at each filter stage and may be derived from a result of multiplication of the stored predetermined one of the first data samples with respective starting ones of the set of filter coefficients, wherein the replaced second predetermined ones of the second data samples are replaced at a predetermined filter stage and are derived from a result of multiplication of a predetermined number of first data samples following the stored predetermined one of the first data samples with the respective starting one of the set of filter coefficients, and wherein the new second data samples are derived from a result of multiplication of the stored predetermined one of the first data samples with the respective starting ones of the set of filter coefficients of other filter stages different from the predetermined filter stage.

First switching means may be provided for supplying the stored predetermined one of the first data samples to a multiplying means of the predetermined stage. Thereby, no additional multiplying means is required for generating the new second data samples.

Furthermore, second switching means may be provided for intermittently supplying the respective staring ones of the set of filter coefficients of the other filter stages and the set of filter coefficients of the predetermined stage to the multiplying means of the predetermined stage. This provides the advantage that the switching means provided at the predetermined stage can also be used for supplying the starting ones of the set of filter coefficients of the other filter stages.

Additionally, third switching means may be provided for successively supplying the set of filter coefficients to multiplying means of the other filter stages. As the filter coefficients are successively supplied by the switching means, the skipping means can be implemented by simply skipping one switching operation of the switching means.

In general, each of the first to third switching means serve to reduce the amount of changes required to the efficient implementation of the data processing device.

Finally, fourth switching means may be provided for connecting an input terminal of the data processing device to a zero data value so as to introduce a predetermined delay to the second data samples. The fourth switching means severs to provide a simple additional delay functionality for delaying the input data stream by a fraction of the input clock cycle.

The present invention will now be described on the basis of a preferred embodiment with reference to the accompanying drawings, in which.

The preferred embodiment will now be described based on the efficient interpolation filter arrangement as initially described.

Figure 5:
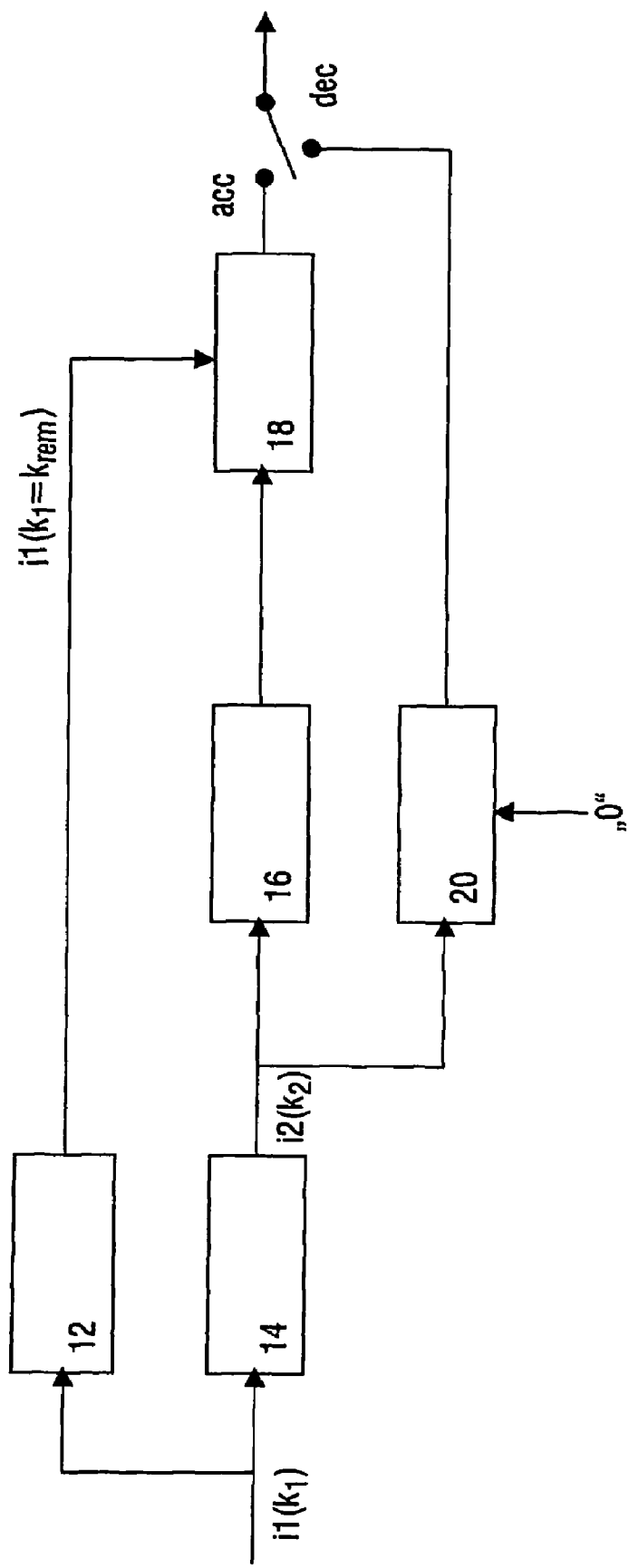
FIG. 5 shows a schematic block diagram of a data processing function with an acceleration option according to the preferred embodiment.

First of all, the general principal of the acceleration function according to the present invention is described on the basis of a data processing block diagram as shown in FIG. 5.

According to FIG. 5, an input data stream $i1(k_1)$ of the first data rate $R_1$ with a chip or data sequence $k_1$ is supplied to a data processing function 14 with an oversampling processing for generating a data stream $i2(k_2)$ of the second data rate R2 with a chip or data sequence $k_2$.

The generated data stream $i2(k_2)$ has the higher data rate $R_2$ due to the oversampling processing. According to the preferred embodiment, a memory function 12 is provided for storing a predetermined input data sample $i_1(k_1=k_{rem})$ to be supplied at a later processing stage to a replacing function 18 where predetermined ones of the generated higher-rate data samples are replaced by new data samples derived from the stored predetermined input data sample $i_1(k_1=k_{rem})$. The higher-rate data samples of the output data stream $i2(k_2)$ are supplied to a skipping function 16 at which predetermined ones of the generated higher-rate data samples are skipped in order to accelerate the timing of the data stream by a fraction of the input clock cycle of the input data stream $i1(K_1)$. The modified data stream is supplied to the replacing function 18 where other ones of the data samples following the skipped data samples are replaced by the new data samples derived from the stored predetermined one of the low-rate input data samples.

In an optional parallel data path, the high-rate data samples are supplied to an insertion function 20 where zero data values are inserted at predetermined positions so as to generate a delayed or decelerated timing of the data stream. The output streams of the replacing function 18 or the insertion function 20 can be selectively switched to an output of the processing device, at which correspondingly time adjusted data streams can be provided and supplied to an interpolation function for converting the high-rate data stream to a time-adjusted low-rate data stream of a data rate corresponding to the first data rate $R_1$.

Hence, acceleration of the timing or clock can be achieved by combined skipping and replacing operation, wherein the replacing operation is adapted to reduce the interpolation error caused by the skipped data values.

Figure 1:
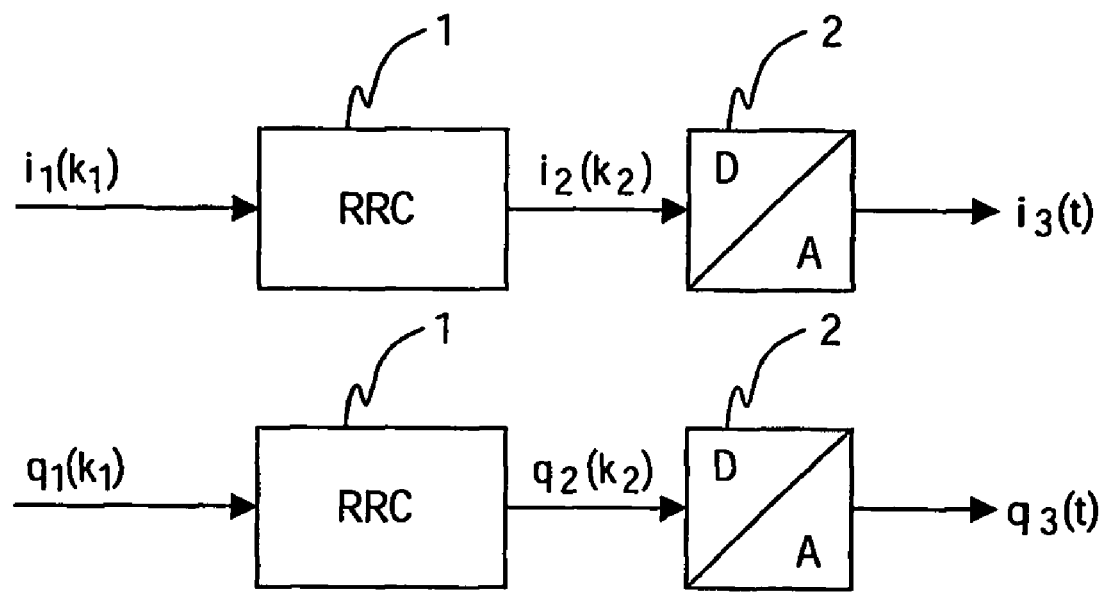
FIG. 1 shows a schematic block diagram of a data processing arrangement in which the present invention can be implemented.
Figure 2:
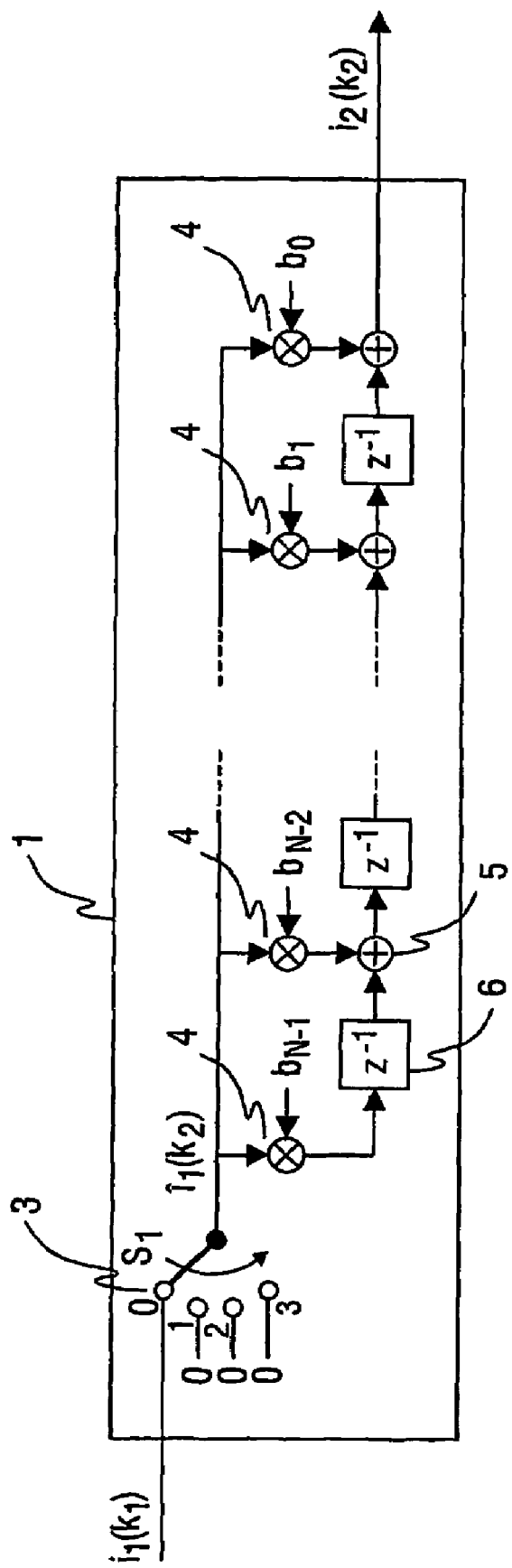
FIG. 2 shows a schematic functional diagram of a known arrangement of an interpolation filter.
Figure 3:
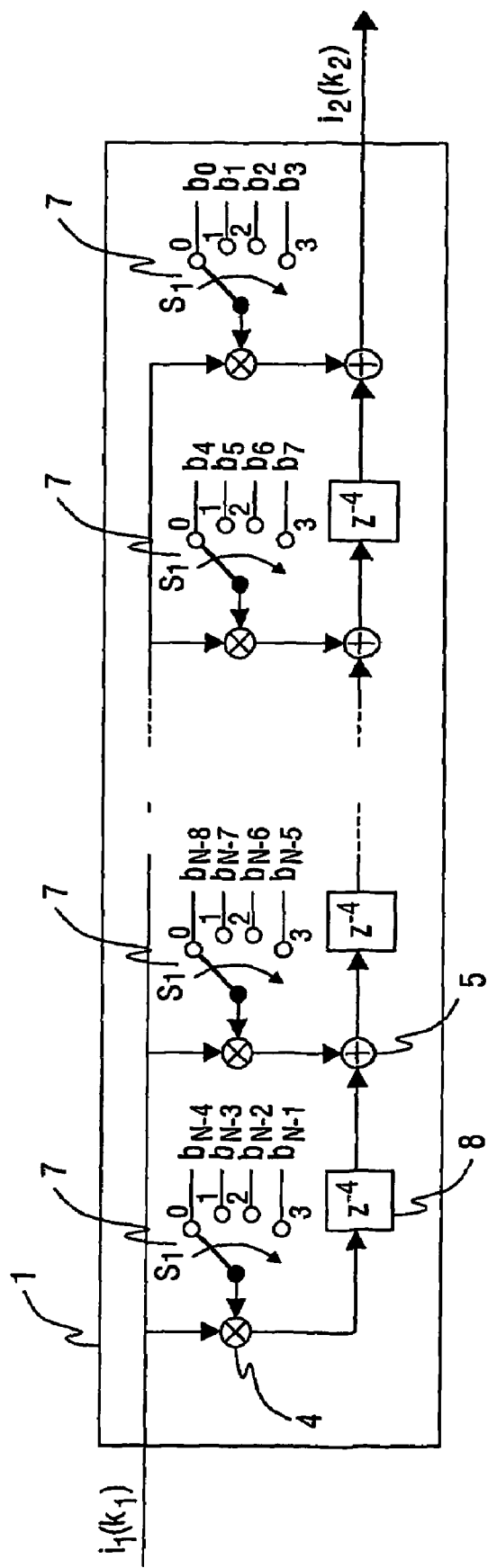
FIG. 3 shows a schematic functional block diagram of an efficient known arrangement of an interpolation filter.
Figure 4:
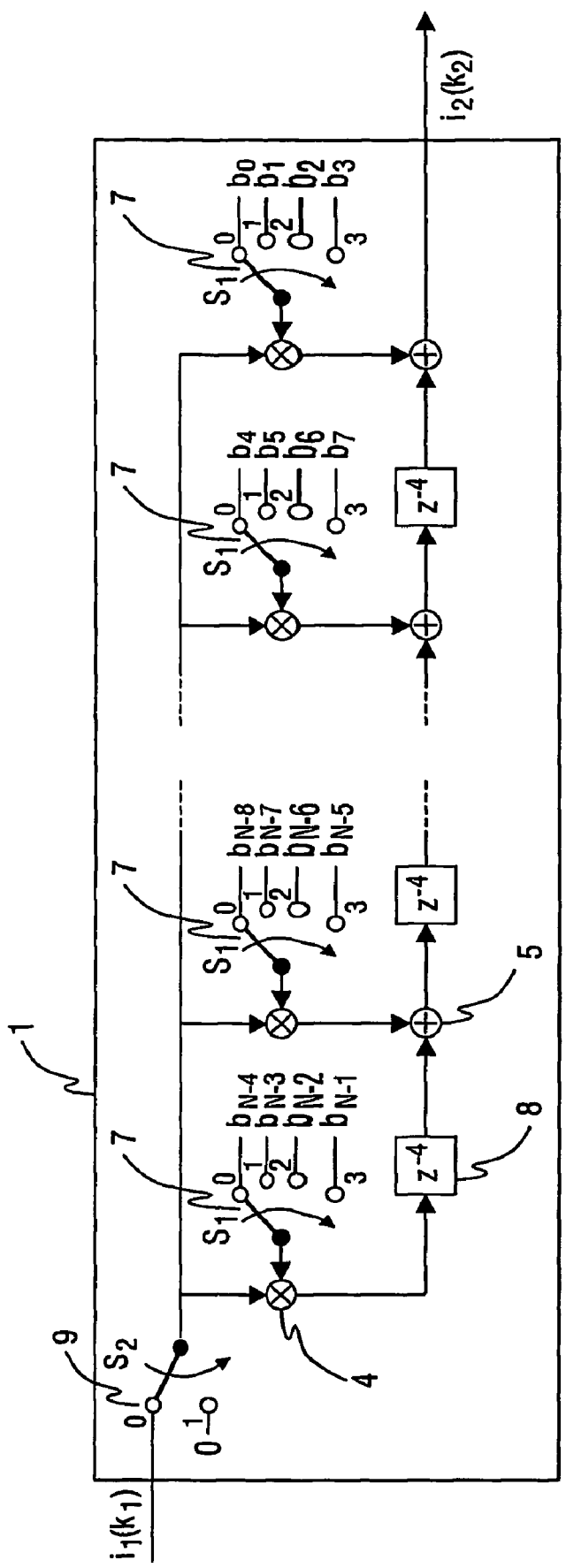
FIG. 4 shows a schematic functional block diagram of a modification of the efficient filter arrangement with a switchable delay function.
Figure 6:
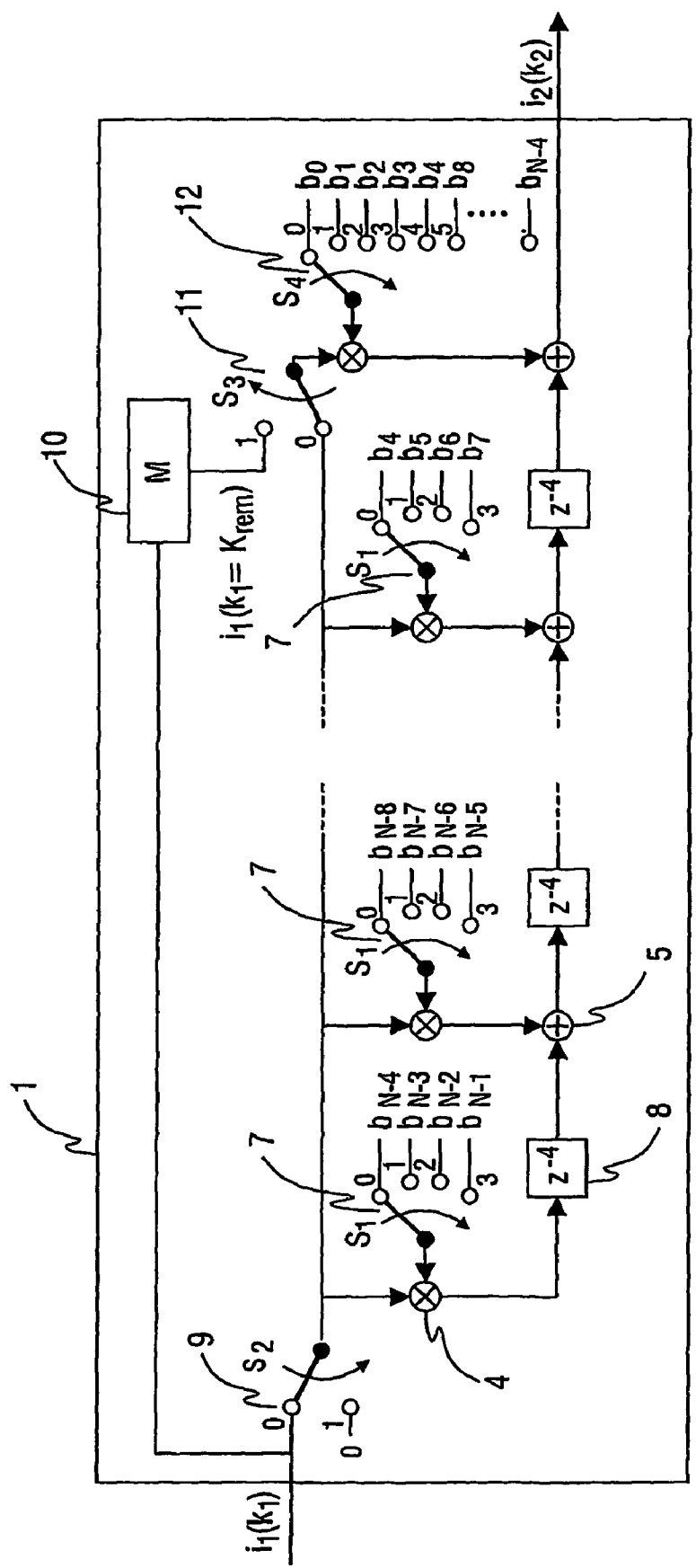
FIG. 6 shows a more detailed implementation of the acceleration option in filter arrangement according to the preferred embodiment.

FIG. 6 shows a more detailed implementation of the skipping and replacing operation based on the effective filter arrangement of FIG. 3.

As shown in FIG. 6, a memory function 10 is provided for storing the predetermined input data value $i_1(k_1=k_{rem})$, and two additional switching functions 11, 12 are provided for selectively switching the stored predetermined input data value to the multiplier of the last filter stage and for modifying the switching of the filter coefficients $b_0$ to $b_3$ so as to be capable of selectively providing additional filter coefficients $b_4, b_8, \ldots, b_{N-4}$ which are to be multiplied with the predetermined input data value stored in the memory function 10.

multiplication results over predetermined following cycles, the interpolation error can be reduced This advantage can be achieved at the expense of providing the additional first and second switching functions 11, 12 and the additional memory function 10 which, however, do not require any substantial modification. As a main advantage, the number of multipliers does not have to be changed.

It is to be noted that the elements of the functional diagram of FIG. 6 can be implemented on a software basis in a data processing device or on a hardware basis by discrete switching, arithmetic and delay elements, or even by a combination of hardware and software functions. The main advantage of the present invention results in the reduced interpolation error and the kept efficient implementation of the interpolation filter with its reduced number of multipliers.

Furthermore, it is to be noted that the present invention is not restricted to the above preferred embodiment but can be applied in any interpolation filter or data processing device, where an oversampling takes place and where the time base has to be adjusted at a fraction of the input rate, i.e. by a time

TABLE 3

| | | | | | | | | | time | | | | | | | | | | |
|---|---|---|---|---|---|---|---|---|---|---|---|---|---|---|---|---|---|---|---|
| Input signal | | i1(k1) | | | | i1(k1 + 1) | | | | i1(k1 + 2) | | | | i1(k1 + 3) | | | | i1(k1 + 4) | | |
| S1 | 0 | 1 | 2 | 3 | 1 | 2 | 3 | 0 | 1 | 2 | 3 | 0 | 1 | 2 | 3 | 0 | 1 | 2 | 3 |
| S2 | 0 | 0 | 0 | 0 | 0 | 0 | 0 | 0 | 0 | 0 | 0 | 0 | 0 | 0 | 0 | 0 | 0 | 0 | 0 |
| S3 | 0 | 0 | 0 | 0 | 0 | 0 | 0 | 1 | 0 | 0 | 0 | 1 | 0 | 0 | 0 | 1 | 0 | 0 | 0 |
| S4 | 0 | 1 | 2 | 3 | 1 | 2 | 3 | 4 | 1 | 2 | 3 | 5 | 1 | 2 | 3 | 6 | 1 | 2 | 3 |
| Multiplier 1 | i1(0) b0 | i1(0) b1 | i1(0) b2 | i1(0) b3 | i1(1) b1 | i1(1) b2 | i1(1) b3 | i1(1) b4 | i1(2) b1 | i1(2) b2 | i1(2) b3 | i1(1) b8 | i1(3) b1 | i1(3) b2 | i1(3) b3 | i1(1) b12 | i1(4) b1 | i1(4) b2 | i1(4) b3 |
| Multiplier 2 | i1(0) b4 | i1(0) b5 | i1(0) b6 | i1(0) b7 | i1(1) b5 | i1(1) b6 | i1(1) b7 | i1(2) b4 | i1(2) b5 | i1(2) b6 | i1(2) b7 | i1(3) b4 | i1(3) b5 | i1(3) b6 | i1(3) b7 | i1(4) b4 | i1(4) b5 | i1(4) b6 | i1(4) b7 |
| Multiplier 3 | i1(0) b8 | i1(0) b9 | i1(0) b10 | i1(0) b11 | i1(1) b9 | i1(1) b10 | i1(1) b11 | i1(2) b8 | i1(2) b9 | i1(2) b10 | i1(2) b11 | i1(3) b8 | i1(3) b9 | i1(3) b10 | i1(3) b11 | i1(4) b8 | i1(4) b9 | i1(4) b10 | i1(4) b11 |
| Multiplier 4 | i1(0) b12 | i1(0) b13 | i1(0) b14 | i1(0) b15 | i1(1) b13 | i1(1) b14 | i1(1) b15 | i1(2) b12 | i1(2) b13 | i1(2) b14 | i1(2) b15 | i1(3) b12 | i1(3) b13 | i1(3) b14 | i1(3) b15 | i1(4) b12 | i1(4) b13 | i1(4) b14 | i1(4) b15 |

As can be gathered form table 3, an acceleration of the timing is achieved by first omitting the data values corresponding to the first cycle of the second input data value $i_1(k_1+1)$. This can be achieved by having skipped the first switching terminal "0" of the first switching function 7. This means, that the switch $S_1$ of the first switching function 7 proceeds from the last switching terminal "3" directly to the second switching terminal "1" in response to a command or control signal indicating initiation of the acceleration function. Thus, the results of multiplication of the data value $i_1(k_1+1)$ by the filter coefficient $b_0, b_4, \ldots, b_{N-4}$ are omitted and the respective input data value $i_1(k_1+1)$ is stored in the memory function 10. To alleviate or reduce the interpolation error caused by this omission, the multiplication function at the last filter stage is temporarily modified by supplying the stored input data value $i_1(k_1+1)$ which corresponds to the value $i_1(1)$ of table 3 to the multiplier 4 of the last filter stage at the first one of the four higher-rate data cycles for N/4−1 following input data values. This is indicated in table 3 by the row corresponding to a switch $S_3$ of the first additional switching function 11. Additionally, as can be gathered from the row corresponding to a switch $S_4$ of the second additional switching function 12, the conventional switching cycle is interrupted and the additional switching terminals $b_4$, $b_8, \ldots, b_{N-4}$ are intermittently connected to the multiplier 4 each time the switch $S_3$ of the first additional switching function 11 connects to the output of the memory function 10. Thereby, the omitted multiplication results of the skipped data cycle are successively and intermittently inserted instead of the normal multiplication results occurring in the last filter stage at these cycles. Due to the distribution of the omitted period corresponding to a cycle of the higher oversampling rate. In particular, the interpolation factor is not limited to four. It can be any integer number larger or equal to 2. Moreover, the skipping of data samples may be performed at any other suitable cycle, wherein any number of data samples can be replaced at any position suitable to reduce the interpolation error. If the omitted multiplication results of the skipped data cycle are inserted in another one than the last right filter stage, the number of omitted multiplication results which can be inserted is reduced by one with each change to a left neighboring filter stage. However, such a change is possible in principle. The preferred embodiments may thus vary within the scope of the attached claims.

The invention claimed is:

1. A data processing device for receiving an input stream of first data samples at a first rate and for generating an output stream of second data samples at a higher second rate by inserting additional data samples generated from said first data samples, said device comprising:

a) means for storing a predetermined one of said first data samples; and b) means for adjusting the timing of said output stream, said time adjusting means comprising:

b1) means for skipping first predetermined ones of said second data samples derived from said stored predetermined one of said first data samples; and b2) means for replacing second predetermined ones of said second data samples following said skipped first predetermined ones of said second data samples by new second data samples derived from said stored predetermined one of said first data samples.

2. A device according to claim 1, wherein said data processing device is an interpolation filter in which said second data samples are obtained by successively multiplying each of said first data samples by a set of filter coefficients, and by adding an obtained result of multiplication at a predetermined filter stage to a delayed result of the preceding filter stage, wherein said delayed result has been delayed by a delay time corresponding to a time period of said first rate.

3. A device according to claim 2, wherein said skipped first predetermined ones of said second data samples are skipped at each filter stage and are derived from a result of multiplication of said stored predetermined one of said first data samples with respective starting ones of said set or filter coefficients, said replaced second predetermined ones of said second data samples are replaced at a predetermined filter stage and are derived from a result of multiplication of a predetermined number of first data samples following said stored predetermined one of said first data samples with the respective starting one of said set of filter coefficients, and said new second data samples are derived from a result of multiplication of said stored predetermined one of said first data samples with the respective starting ones of said set of filter coefficients of other filter stages different from said predetermined filter stage.

4. A device according to claims 3, further comprising first switching means for supplying said stored predetermined one of said first data samples to a multiplying means of said predetermined filter stage.

5. A device according to claim 4, further comprising second switching means for intermittently supplying said respective starting ones of said set of filter coefficients of said other filter stages and said set of filter coefficients of said predetermined stage to said multiplying means of said predetermined stage.

6. A device according to claim 2, further comprising third switching means for successively supplying said set of filter coefficients to multiplying means of said other filter stages.

7. A device according to any one of the proceeding claims, further comprising fourth switching means for connecting an input terminal of said data processing device to a zero data value so as to introduce a predetermined delay to said second data samples.

8. A method of adjusting the timing of a higher-rate stream of second data samples derived from a lower-rate stream of first data samples, said method comprising the steps of:

a) storing a predetermined one of said first data samples;

b) skipping first predetermined ones of said second data samples derived from said stored predetermined one of said first data samples; and c) replacing second predetermined ones of said second data samples following said skipped first predetermined ones of said second data samples by new second data samples derived from said stored predetermined one of said first data samples.

* * * * *